US012506005B2

(12) United States Patent
Lutker-Lee et al.

(10) Patent No.: US 12,506,005 B2
(45) Date of Patent: Dec. 23, 2025

(54) METHODS AND STRUCTURES FOR INCREASING STABILITY OF SOFT OR ORGANIC FEATURES

(71) Applicant: Tokyo Electron Limited, Tokyo (JP)

(72) Inventors: Katie Lutker-Lee, Albany, NY (US); Eric Chih-Fang Liu, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 275 days.

(21) Appl. No.: 18/203,975

(22) Filed: May 31, 2023

(65) Prior Publication Data

US 2024/0404829 A1 Dec. 5, 2024

(51) Int. Cl.
| | |
|---|---|
| H01L 21/033 | (2006.01) |
| H01L 21/027 | (2006.01) |
| H01L 21/3065 | (2006.01) |
| H01L 21/308 | (2006.01) |
| H01L 21/311 | (2006.01) |
| H01L 21/3213 | (2006.01) |

(52) U.S. Cl.
CPC ........ *H01L 21/033* (2013.01); *H01L 21/0273* (2013.01); *H01L 21/0334* (2013.01); *H01L 21/3065* (2013.01); *H01L 21/308* (2013.01); *H01L 21/3086* (2013.01); *H01L 21/31105* (2013.01); *H01L 21/31116* (2013.01); *H01L 21/31138* (2013.01); *H01L 21/31144* (2013.01); *H01L 21/32139* (2013.01)

(58) Field of Classification Search
None
See application file for complete search history.

(56) References Cited

U.S. PATENT DOCUMENTS

2018/0047578 A1* 2/2018 Morikita .......... H01L 21/02164

FOREIGN PATENT DOCUMENTS

WO  WO2020167944  *  8/2020  ........... G05B 19/401

* cited by examiner

*Primary Examiner* — Jiong-Ping Lu
(74) *Attorney, Agent, or Firm* — Foley & Lardner LLP

(57) ABSTRACT

The present disclosure relates to methods and structures of increasing stability of soft or organic features. The methods disclosed herein may include lining soft/organic features with a lining material, depositing a lining material on the soft/organic features, or otherwise fabricating a lining structure. This provides mechanical support for the soft/organic features, thereby increasing stability of the soft/organic features. The methods, structures, and techniques described herein provide mechanical support for a soft/organic feature, thereby enabling better pattern transfer through semiconductor device fabrication processes, especially at reduced pitch and increased aspect ratio. A method for fabricating semiconductor devices may include spin-coating a patternable material on a substrate, patterning the patternable material to form a pattern including one or more protruding structures, and lining sidewalls of each of the one or more protruding structures with a silicon-containing material.

20 Claims, 7 Drawing Sheets

---

Forming a patternable material on a substrate
105

Patterning the patternable material to form a pattern including one or more protruding structures
110

Lining sidewalls of each of the one or more protruding structures with a silicon-containing material
115

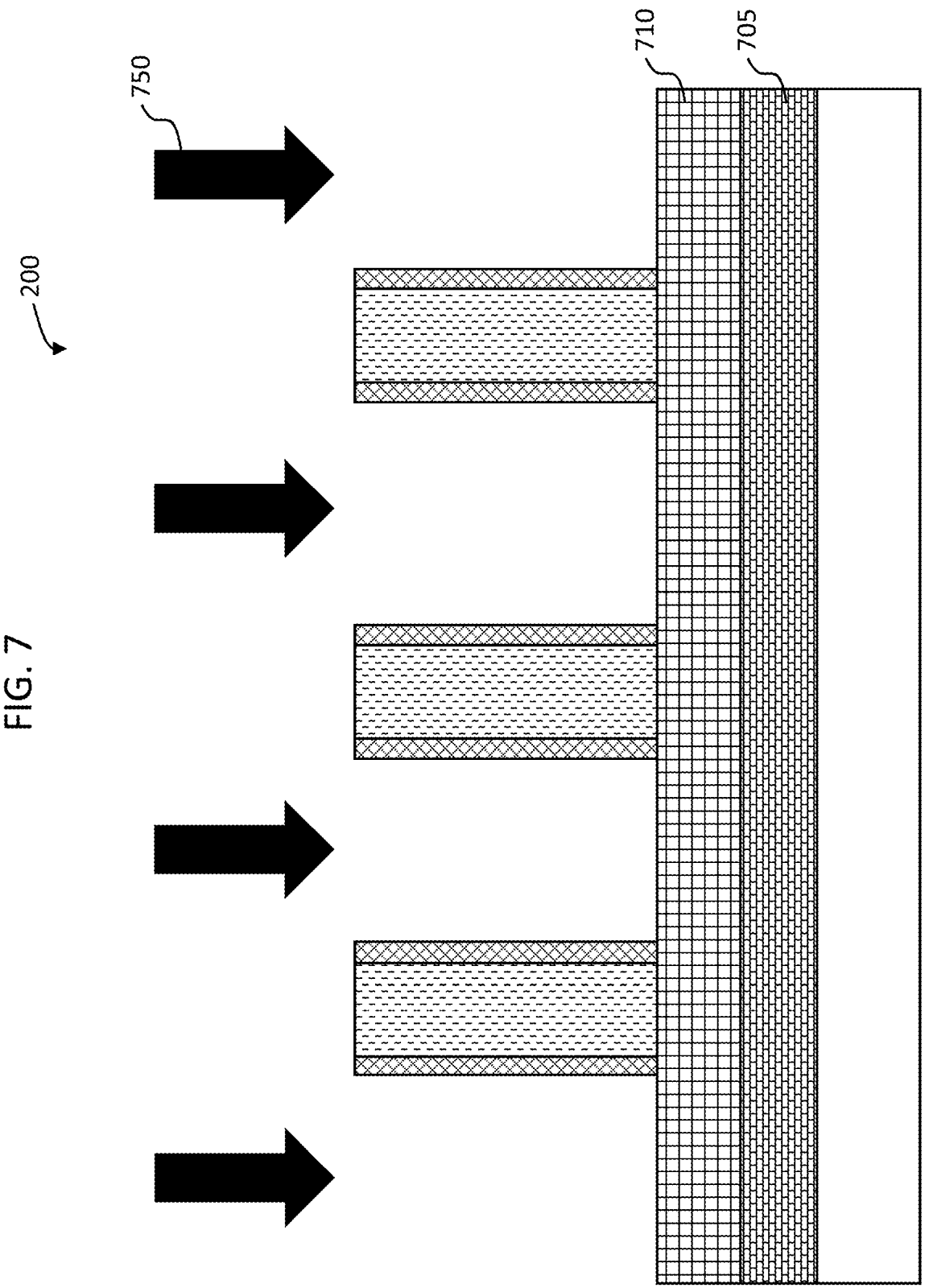

METHODS AND STRUCTURES FOR INCREASING STABILITY OF SOFT OR ORGANIC FEATURES

FIELD OF THE DISCLOSURE

This disclosure generally relates to methods for fabricating semiconductor devices, and more particularly to structures used in such fabrication methods.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. While semiconductor devices have scaled down with their feature sizes decreased and aspect ratios increased, such scaling efforts are running into greater challenges as scaling enters single digit nanometer semiconductor device fabrication processes. Although nanoscale semiconductor fabrication processes have been successfully demonstrated and implemented, various embodiments can include numerous operations, and may include increasing stability of semiconductor device element or features.

SUMMARY

The present disclosure relates to methods and structures of increasing stability of soft or organic features. The methods disclosed herein may include lining soft/organic features with a lining material, depositing a lining material on the soft/organic features, or otherwise fabricating a lining structure. This provides mechanical support for the soft/organic features, thereby increasing stability of the soft/organic features. The methods, structures, and techniques described herein provide mechanical support for a soft/organic feature, thereby enabling better pattern transfer through semiconductor device fabrication processes, especially at reduced pitch and increased aspect ratio.

One aspect of the present disclosure can be directed to a method for fabricating semiconductor devices. The method includes spin-coating a patternable material on a substrate, patterning the patternable material to form a pattern including one or more protruding structures, and lining sidewalls of each of the one or more protruding structures with a silicon-containing material.

In some embodiments, the method may include patterning the substrate, with the pattern together with the silicon-containing material serving as a mask.

In some embodiments, the step of patterning the patternable material may include forming a patterned material over the patternable material, and etching the patternable material to form the pattern, with the patterned material serving as a mask.

In some embodiments, the step of lining sidewalls of each of the one or more protruding structures may include depositing the silicon-containing material with at least one of the following silicon-containing precursors: $SiF_4$ or $SiCl_4$, removing first portions of the silicon-containing material that overlay the patterned material and second portions of the silicon-containing material that overlay a top surface of the substrate, and removing the patterned material.

In some embodiments, the step of lining sidewalls of each of the one or more protruding structures may include depositing the silicon-containing material with at least one of the following silicon-containing precursors: $SiF_4$ or $SiCl_4$, while simultaneously removing the patterned material, wherein the silicon-containing material also overlays a top surface of each of the one or more protruding structures.

In some embodiments, the patternable material may include at least one of an organic material, a carbon-based material, or a soft material.

In some embodiments, a thickness of the silicon-containing material may be equal to or less than about 5 nanometers (nm).

In some embodiments, the silicon-containing material lining the sidewalls may be configured to provide mechanical support for each of the one or more protruding structures of the pattern.

Another aspect of the present disclosure can be directed to a method for fabricating semiconductor devices. The method includes forming a soft material on a substrate, patterning the soft material to form a plurality of protruding structures, and depositing a lining material to line sidewalls of each of the plurality of protruding structures, wherein the lining material is configured to provide mechanical support for each of the plurality of protruding structures.

In some embodiments, the method may include patterning the substrate using the plurality of protruding structures lined with the silicon-containing material as a mask.

In some embodiments, the step of patterning the soft material may include forming a patterned material over the soft material, and etching the soft material to form the plurality of protruding structures, with the patterned material serving as a mask.

In some embodiments, the step of depositing a lining material may include depositing a silicon-containing material with at least one of the following silicon-containing precursors: $SiF_4$ and $SiCl_4$, and removing first portions of the silicon-containing material that overlay the patterned material and second portions of the silicon-containing material that overlay a top surface of the substrate, and removing the patterned material.

In some embodiments, the step of depositing a lining material may include depositing a silicon-containing material with at least one of the following silicon-containing precursors: $SiF_4$ or $SiCl_4$, while simultaneously removing the patterned material, wherein the silicon-containing material also overlays a top surface of each of the plurality of protruding structures.

In some embodiments, the method may include depositing an additional material over the plurality of protruding structures.

In some embodiments, the soft material may include at least one of polymers, carbon-based materials, resist materials for photo/electron lithography, molecular crystals, or soft semiconductor materials comprised of molecules forming weak bonds.

In some embodiments, each of the plurality of protruding structures may include a bottom layer of a first material and a top layer of a second material.

Another aspect of the present disclosure can be directed to a method for fabricating semiconductor devices. The method includes providing a plurality of protruding structures of a first material on an underlying layer, and depositing a lining material to line sidewalls of each of the plurality of protruding structures, wherein the lining material is configured to provide mechanical support for each of the plurality of protruding structures.

In some embodiments, the method may include comprising at least one of: patterning the underlying layer, with the lined plurality of protruding structures serving as a mask, or depositing an additional material over at least a portion of the plurality of protruding structures.

In some embodiments, the first material may include at least one of a soft material, an organic material, or a carbon-based material, and the lining material comprises a silicon-containing material.

In some embodiments, a thickness of the lining material may be equal to or less than about 5 nanometers (nm).

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIG. 7 illustrates a cross-sectional view of a semiconductor device during various fabrication stages, made by the method of FIG. 1, in accordance with some embodiments.

DETAILED DESCRIPTION

Figure 1:
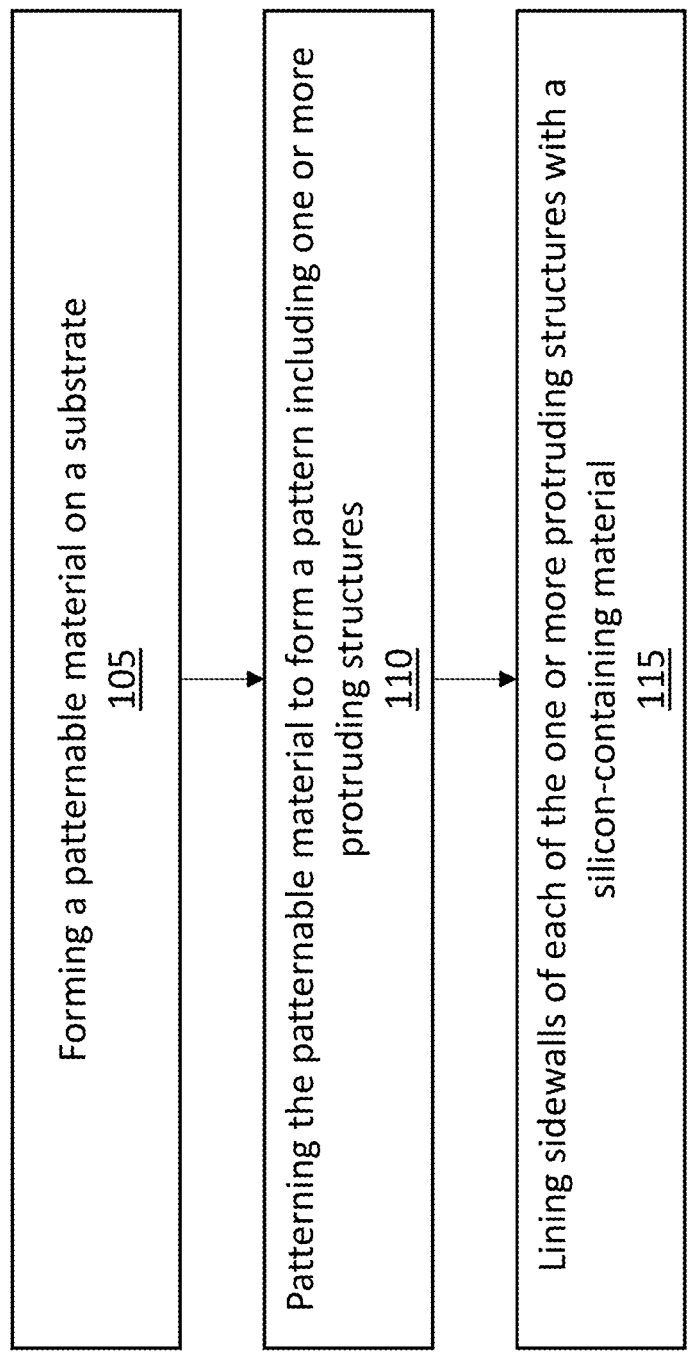
FIG. 1 is a flow chart of a method for fabricating a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to methods and structures for increasing stability of soft/organic features, particularly forming a lining structure configured to provide mechanical support for soft/organic features. While there is a constant need to etch features into organic layers (e.g., resists, organic planarizing layers (OPLs), amorphous carbon, etc.), reduction in feature sizes (and thereby increasing aspect ratios) can cause issues such as high roughness, wiggling, leaning, and collapse. More specifically, soft/organic features have a tendency to lean or collapse after etching processes, leading to poor pattern transfer and high defectivity. This can be induced by mechanism such as stress between the mask and the organic layer, the mask strip chemistry, and aspect ratio, etc. Although some methods have been proposed, such as process tuning (e.g., changing pressure, power, gas ratio, etc.) or chemistry change, they are limited particularly for the increasing aspect ratios and decreasing feature sizes. This disclosure provides methods and structures for providing mechanical support for soft/organic features. This enables better pattern transfer through fabrication processes, especially at reduced pitch and increased aspect ratio, and may provide an easier method for organic mandrel with metal-based resists.

Reference will now be made to the figures, which for the convenience of visualizing the 3 D fabrication techniques described herein, illustrate a substrate undergoing a process flow. Unless expressly indicated otherwise, each figure represents one (or a set) of fabrication steps in a process flow for manufacturing the devices described herein. In the Figures, connections between conductive layers or materials may be shown. However, it should be understood that these connections between various layers and masks are merely illustrative, and are intended to show a capability for providing such connections and should not be considered limiting to the scope of the claims.

Likewise, although the figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a rectangular configuration, other shapes are also contemplated, and indeed the techniques described herein may be implemented in any shape or geometry.

FIG. 1 illustrates a flow chart of a method 100 for fabricating a semiconductor device, in accordance with some embodiments. It is noted that the method 100 is merely an example, and is not intended to limit the present disclosure. Accordingly, it is understood that additional operations may be provided before, during, and after the method 100 of FIG. 1, that any operation may be omitted, and that some other operations may only be briefly described herein.

In various embodiments, operations of the method 100 may be associated with cross-sectional views of an example structure at various fabrication stages as shown in FIGS. 2 to 6, which will be discussed in further detail below. It should be understood that the structure, shown in FIGS. 2 to 6, may include a number of other structures such as spacers, mandrels, etc., while remaining within the scope of the present disclosure.

In brief overview, the method 100 starts with operation 105 of forming a patternable material on a substrate. The method 100 continues to operation 110 of patterning the patternable material to form a pattern including one or more protruding structures. The method can proceed to operation 115 of lining sidewalls of each of the one or more protruding structures with a silicon-containing material.

Figure 2:
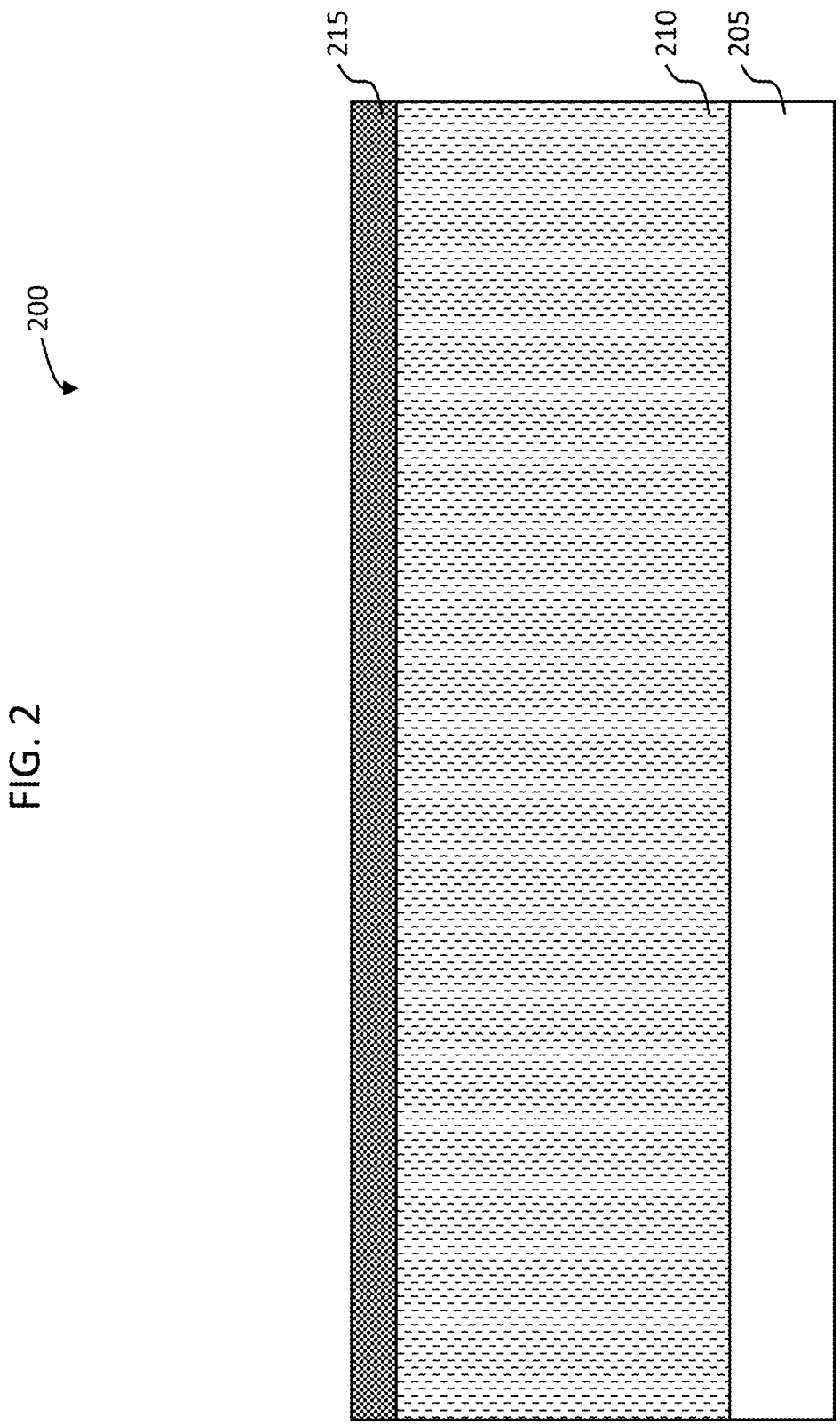
FIG. 2 illustrates a cross-sectional view of a semiconductor device during various fabrication stages, made by the method of FIG. 1, in accordance with some embodiments.

Corresponding to operation 105 of FIG. 1, FIG. 2 is a cross-sectional view of a structure 200 in which a first layer 210 of a first material and a mask layer 215 are formed over a substrate 205, in accordance with various embodiments.

In some embodiments, the substrate 205 may serve as a target to be patterned, while the first layer 210 and the mask layer 215 may collectively serve as a patterned mask to transfer their pattern to the underlying substrate 205. For example, the substrate 205 may be a semiconductor substrate, such as a bulk semiconductor, a semiconductor-on-insulator (SOI) substrate, or the like, which may be doped (e.g., with a p-type or an n-type dopant) or undoped. The substrate 205 may be a wafer, such as a silicon wafer. Other substrates, such as a multi-layered or gradient substrate may also be used. In another example, the substrate 205 may be an intermetal dielectric (e.g., silicon oxide or otherwise low-k dielectric material). In yet another example, the substrate 205 may include a stack of different dielectric materials (e.g., oxide-nitride-oxide) alternately arranged on top of one another.

The first material for the first layer 210 may be a soft or organic material, including but not limited to, polymers, carbon-based materials, resist materials for photo/electron lithography, molecular crystals, or soft semiconductor materials comprised of molecules forming weak bonds (e.g., van der Waals). In some embodiments, the first material is a patternable material. The first layer 210 can be spin-coated, placed, grown (e.g., epitaxially with or without a seed layer), or otherwise formed over the substrate 205. The formation of the one or more layers of the structure 200 can include planarization of the layers, such as by cutting, ablation, chemical mechanical grinding or polishing (CMG/P), or other planarization techniques. The mask layer 215 can be formed over the first layer 210. For example, the mask layer 215 may be spin-coated over the first layer 210. The mask layer may be or include a light-sensitive material (e.g., photoresist) configured to pattern the first layer 210.

In some embodiments, an underlying layer (not shown) may be formed between the first layer 210 and the substrate 205. For example, such an underlying layer together with the first layer 210 and the mask layer 215 may serve as a tri-layer structure to pattern the substrate 205, with the underlying layer serving as a lift-off resist (LOR), the first layer 210 serving as a back anti-reflection coating (BARC), and the mask layer 215 serving as a top photoresist, respectively.

Figure 3:
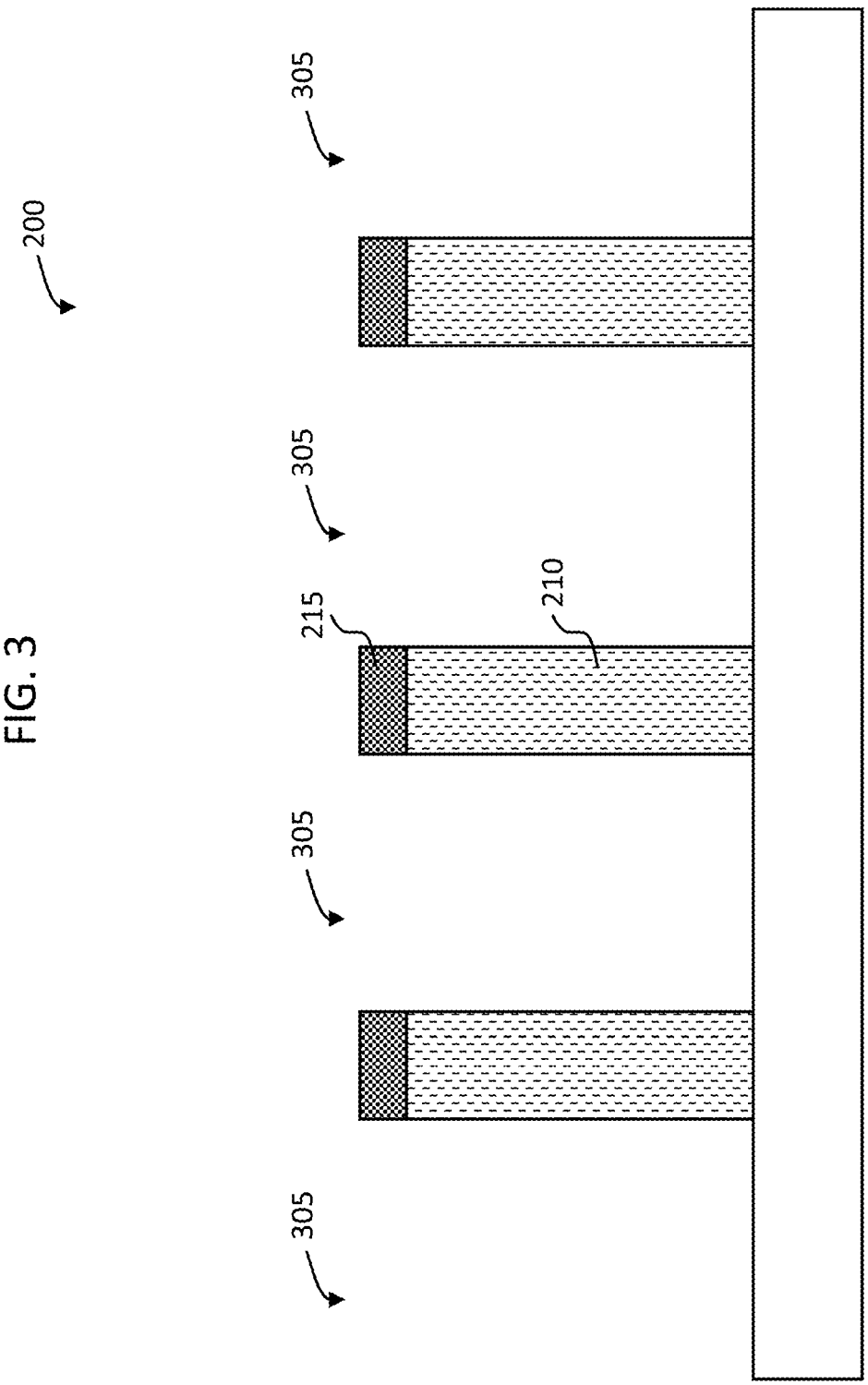
FIG. 3 illustrates a cross-sectional view of a semiconductor device during various fabrication stages, made by the method of FIG. 1, in accordance with some embodiments.

Corresponding to operation 110 of FIG. 1, FIG. 3 is a cross-sectional view of the structure 200, in which the first layer 210 and the mask layer 215 are patterned though an etching portion 305, in accordance with various embodiments. As a result, as shown in FIG. 3, the patterned first layer 210 (hereinafter referred to as a patterned feature 210) and the patterned mask layer 215 (hereinafter referred to as a patterned mask 215) are formed. For example, the first layer 210 and the mask layer 215 over the etching portion 305 may be removed by directionally etching the first layer 210 and the mask layer 215 toward the substrate 205. The first layer 210 and the mask layer 215 can be etched toward the top of the substrate 205. In some embodiments, the mask layer 215 may be patterned to form a pattern so as to selectively etch the first layer 210 and form one or more protruding structures (e.g., the patterned feature 210). In some embodiments, a patterned material may be formed as the mask layer 215 over the first layer 210, and the first layer 210 may be etched to form a pattern (e.g., the patterned feature 210) with the patterned material serving as a mask. In some embodiments, for example when the step of forming the mask layer 215 is omitted, one or more patterned features 210 may be formed on the substrate 205. For example, a seed-based growth method may be used to form a plurality of the patterned features 210 on the substrate 205. In some embodiments, for example when the first layer 210 includes one or more layers, the patterned feature 210 may include one or more sub-features. For example, a bottom portion of the patterned feature 210 may be formed of a first material, and a top portion of the patterned feature 210 may be formed of a second material. For example, a bottom portion of the patterned feature 210 may have a dimension different from a dimension of a top portion of the patterned feature 210.

Figure 4:
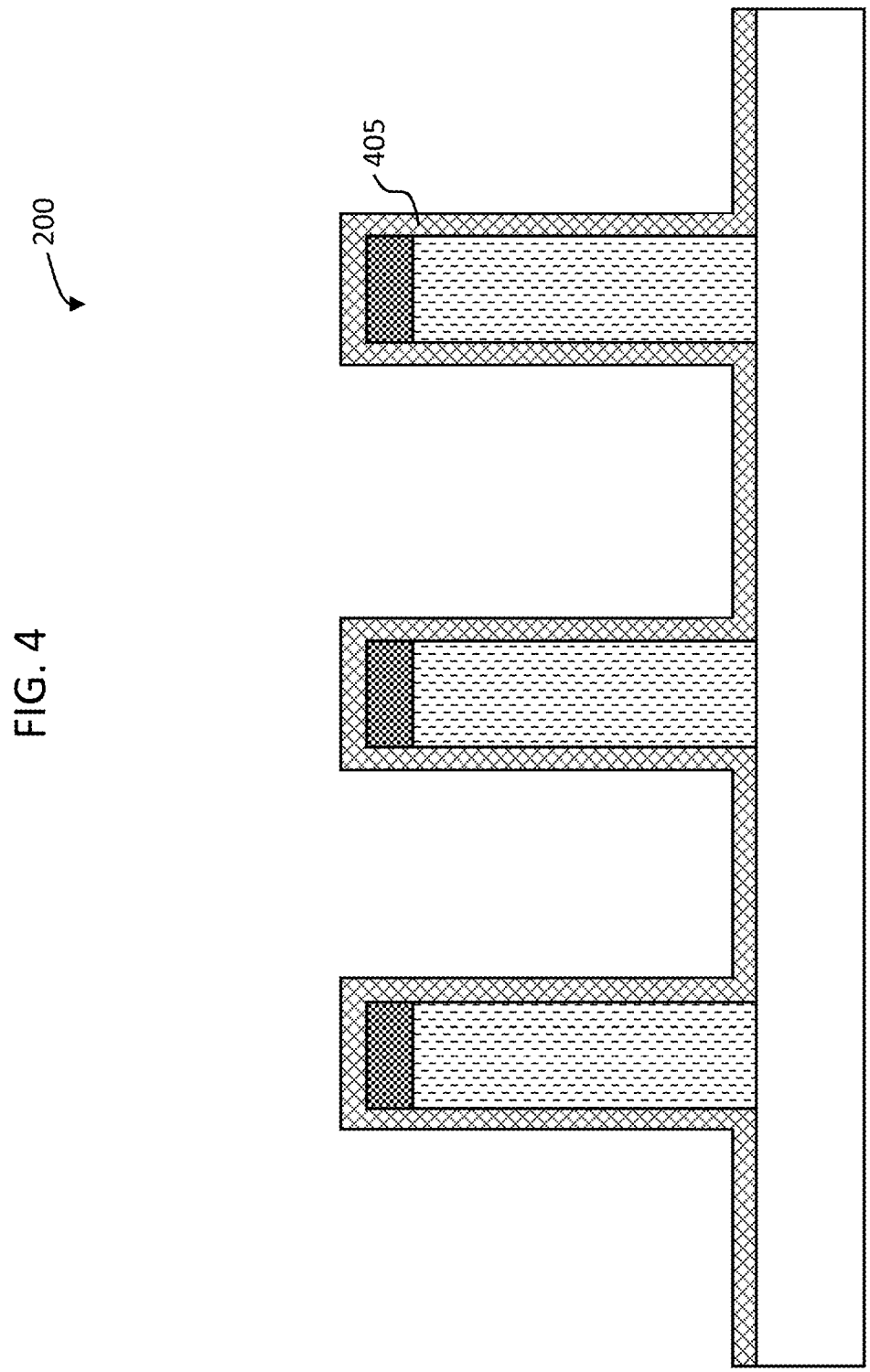
FIG. 4 illustrates a cross-sectional view of a semiconductor device during various fabrication stages, made by the method of FIG. 1, in accordance with some embodiments.

Corresponding to operation 115 of FIG. 1, FIG. 4 is a cross-sectional view of the structure 200, in which at least sidewalls of the patterned feature 210 are lined with a lining layer 405 of a lining material, in accordance with various embodiments. The lining material may be or include, but not limited to, a silicon-containing material or any material configured to provide mechanical support for the patterned feature 210. For example, the lining material may be a material or a group of material whose Young's modulus is lower than that of the first material forming the patterned feature 210. In some embodiments, the lining material may be formed by depositing a silicon-containing material with at least one of silicon-containing precursors (e.g., $SiF_4$, $SiCl_4$, etc.).

As shown in FIG. 4, the lining layer 405 may be formed over the structure 200. More specifically, the lining layer 405 may be formed over the patterned feature 210 and the patterned mask 215 such that the top and sidewalls of the patterned mask 215 and the sidewalls of the patterned feature 210 can be covered with the lining layer 405. The lining layer 405 may be formed over the etching portion 305 over the substrate 205. In some embodiments, for example when the step of forming the patterned mask 215 is omitted, the lining layer 405 may overlay a top surface of the patterned feature 210 (e.g., a top surface of each of the one or more protruding structures). In some embodiments, a thickness of the lining layer 405 may be equal to or less than about 5 nanometers (nm). For example, the thickness of the lining layer 405 may be 1 nm, 3 nm, or 5 nm. In some embodiments, the thickness of the lining layer 405 may vary across the structure 200. For example, the thickness of the lining layer 405 formed on the top surface of the patterned feature 210 may be thicker (or thinner) than that formed on the sidewalls of the patterned feature 210 or that formed over the etching portion 305. In some embodiments, the lining layer 405 may be in-situ deposited.

Although the lining layer 405 is depicted as a single layer in FIG. 4, it should be understood that the lining layer 405 may be formed to have one or more layers while remaining within the scope of the present disclosure. For example, in some embodiments, the lining layer 405 may include a first lining layer of a first lining material and a second lining layer of a second material. For example, in some embodiments, the lining layer 405 may have different portions each of which has a different thickness. Any deposition method may be used to form the lining layer 405, including but not limited to, chemical vapor deposition (CVD), physical vapor deposition (PVD), plasma enhanced CVD (PECVD), molecular beam epitaxy (MBE), metal organic CVD (MOCVD), or the like. The dimensions, shapes, and formation methods of the lining layer 405 described herein are merely non-limiting examples, and other embodiments may be possible. These and other variations are fully intended to be included within the scope of the present disclosure.

Figure 5:
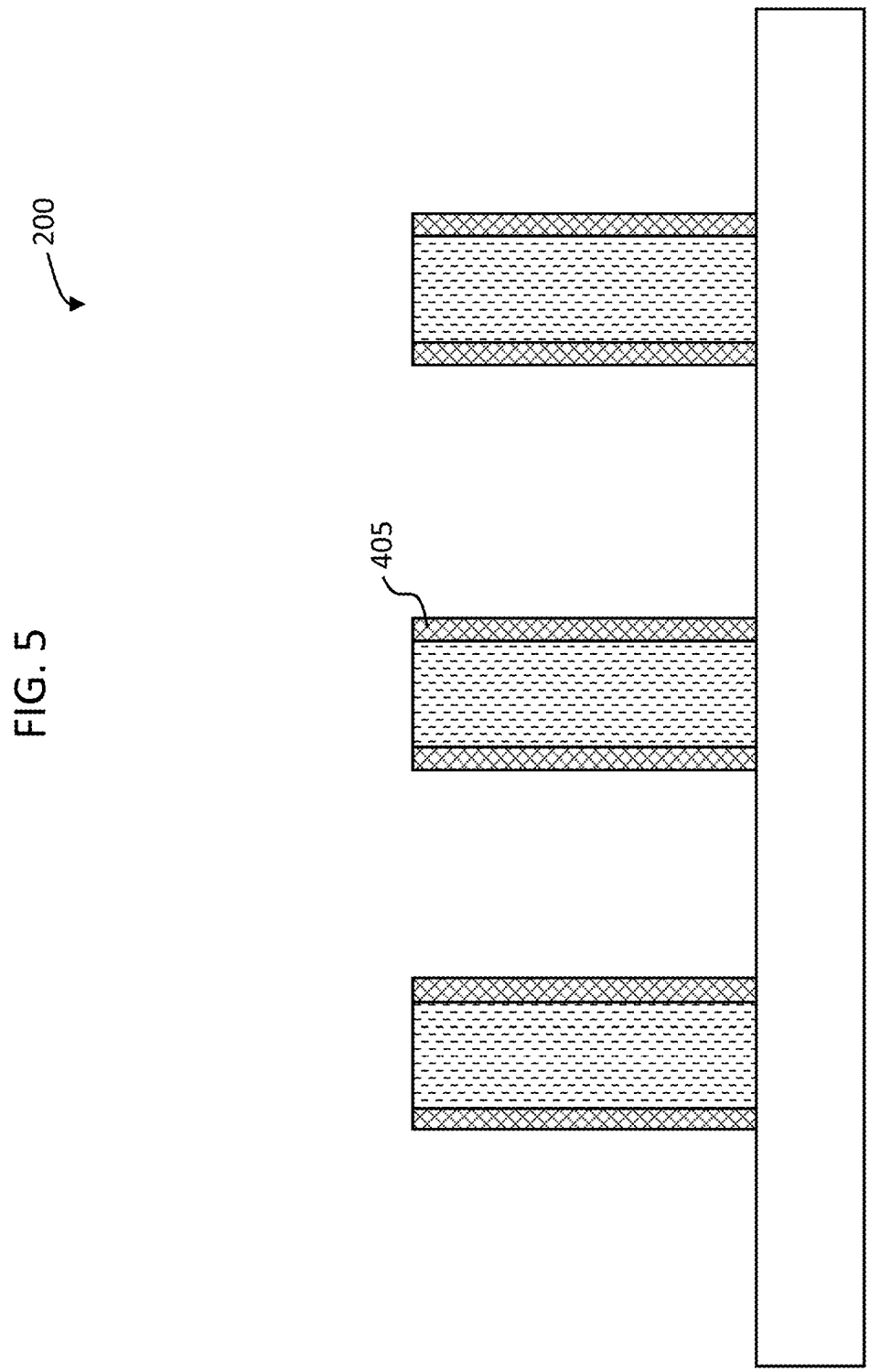
FIG. 5 illustrates a cross-sectional view of a semiconductor device during various fabrication stages, made by the method of FIG. 1, in accordance with some embodiments.

Still corresponding to operation 115 of FIG. 1, FIG. 5 is a cross-sectional view of the structure 200, in which a top portion of the lining layer 405 and the patterned mask 215 are removed, in accordance with various embodiments. As a result, as shown in FIG. 5, a remaining portion of the lining layer 405 (hereinafter referred to as a lining structure 405) lines at least a portion of the patterned feature 210. The lining structure 405 is configured to provide mechanical support for each of the patterned feature 210. For example, the lining structure 405 may prevent the patterned feature 210 from degrading, flopping, bending, wiggling, leaning, collapsing, or otherwise structurally deforming (e.g., before/during subsequent processing). In some embodiments, the lining structure 405 can provide protection during downstream processes such as mask removal and underlayer etch, which may be performed in an etch chamber. In some embodiments, the lining structure 405 may help improve roughness of the patterned feature 210 by protecting the sidewalls of the patterned feature 210 (e.g., during subsequent steps such as mask stripping).

In some embodiments, the lining structure 405 may include one or more layers, each layer being a different material. In some embodiments, a thickness of the lining structure 405 may be equal to or less than about 5 nanometers (nm). For example, the thickness of the lining layer 405 may be 1 nm, 3 nm, or 5 nm. In some embodiments, a critical dimension of the lining structure 405 may be equal to or less than about 10.

The lining structure 405 of FIG. 5 can be formed by removing the lining layer 405 formed on the top portion of the patterned feature 210 and/or removing the patterned mask 215. The lining layer 405 formed on the top portion of the patterned feature 210 and the patterned mask 215 may be removed through one or more etching processes. For example, the lining layer 405 formed on the top portion of the patterned feature 210 may be removed by directional etching. For example, the patterned mask 215 may be removed by wet-etching. In some embodiments, the lining layer 405 formed over the etching portion 305 on the substrate 205 may be removed when etching the lining layer 405 formed on the top portion of the patterned feature 210.

In some embodiments, operation 115 of FIG. 1 may be followed by patterning the substrate 205 with the patterned feature 210 and the lining structure 405 serving as a mask. For example, the etching portion 305 of the substrate 205 may be directionally etched while the patterned feature 210 and the lining structure 405 serves as a mask. In some embodiments, operation 115 of FIG. 1 may be followed by depositing an additional material over the structure 200. For example, any material (e.g., materials for spacers) may be deposited over the top/sidewalls of the patterned feature 210 and the etching portion 305 of the substrate 205. In some embodiments, operation 115 of FIG. 1 may be followed by various downstream processes including, but not limited to, wet processes, ion implantation, etc.

Figure 6:
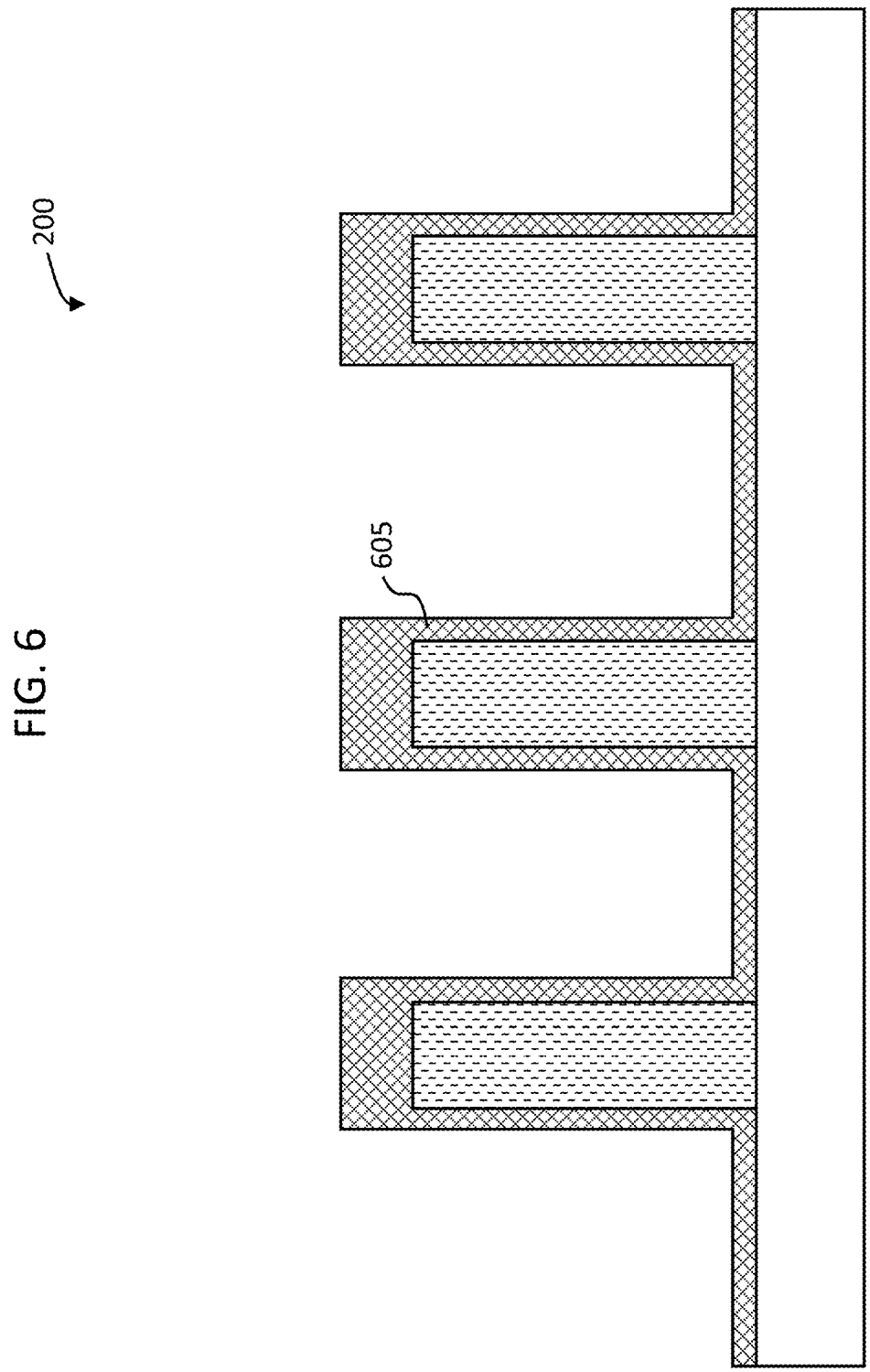
FIG. 6 illustrates a cross-sectional view of a semiconductor device during various fabrication stages, made by the method of FIG. 1, in accordance with some embodiments.

Alternatively, corresponding still to operation 115 of FIG. 1, FIG. 6 is a cross-sectional view of the structure 200, in which a lining layer 605 is formed while the patterned mask 215 is simultaneously removed, in accordance with various other embodiments. For example, one or more operations may be implemented on the structure 200 of FIG. 3 to form the lining layer 605 of FIG. 6. For example, a lining material for the lining layer 605 may be deposited over the structure 200. For example, the step of depositing the lining layer 605 may simultaneously remove the patterned mask 215 so as to form the lining layer 605. The lining layer 605 may be identical or substantially similar to the lining layer 405.

The lining layer 605 may be formed over the structure 200. More specifically, the lining layer 605 may be formed over the patterned feature 210 and the substrate 205 such that the top and sidewalls of the patterned feature 210 can be covered with the lining layer 605. The lining layer 605 may be formed over the etching portion 305 over the substrate 205. In some embodiments, a thickness of the lining layer 605 may be equal to or less than about 5 nanometers (nm). For example, the thickness of the lining layer 605 may be 1 nm, 3 nm, or 5 nm. In some embodiments, the thickness of the lining layer 605 may vary across the structure 200. For example, the thickness of the lining layer 605 formed on the top surface of the patterned feature 210 may be thicker than that formed on the sidewalls of the patterned feature 210 or that formed over the etching portion 305 of the substrate 205. The lining material for the lining layer 605 may be identical or substantially similar to the lining material for the lining layer 405. The lining material may be or include, but not limited to, a silicon-containing material or any material configured to provide mechanical support for the patterned feature 210. For example, the lining material may be a material or a group of material whose Young's modulus is lower than that of the first material forming the patterned feature 210. In some embodiments, the lining material may be formed by depositing a silicon-containing material with at least one of silicon-containing precursors (e.g., $SiF_4$, $SiCl_4$, etc.).

The step of forming the lining layer 605 may be followed by etching the lining layer 605 formed on the etching portion 305 of the substrate 205 and/or the lining layer 605 formed on the top surface of the patterned feature 210 so as to form the structure 200 shown in FIG. 5. In some embodiments, only a portion of the lining layer 605 formed on the top surface of the patterned feature 210 may be removed such that the lining layer 605 surrounds the top and sidewalls of the patterned feature 210 while the lining layer 605 formed on the etching portion 305 of the substrate 205 is completely removed.

FIG. 7 is a cross-sectional view of the structure 200, on which an example operation is performed following operation 115 of FIG. 1, in accordance with various embodiments. As shown in FIG. 7, the patterned feature 210 and the lining structure 405 may serve as a mask when etching an underlying layer through an etching process 750.

In some embodiments, the etching process 750 may be performed to etch the substrate 205. In some embodiments, the etching process 750 may be performed to etch one or more underlying layers formed on the substrate 205. For example, the substrate 205 may have different configurations for different applications, and the patterned feature 210 and the lining structure 405 may serve as a mask to etch substrates with various configurations or one or more underlying layers formed on such substrates. For example, the substrate 205 may have one or more layers formed thereon as shown in FIG. 7, wherein a first underlying layer 705 is formed between a second underlying layer 710 and the substrate 205, and the patterned feature 210 and the lining structure 405 are formed on the second underlying layer 710. In some embodiments, the substrate 205 may have a stack of layers alternately formed of different materials. For example, the structure 200 may be a portion of a 3 D NAND memory device, in which the substrate 205 may include a stack of oxide-nitride-oxide layers. In some embodiments, when the patterned feature 210 and the lining structure 405 are used as a mask, the second underlying layer 710 may be completely etched and the first underlying layer 705 may be partially etched or not etched. In some embodiments, the second underlying layer 710 may be partially etched. The etching process 750 may be or include a dry etching or a wet etching, and may include one or more etching steps. The etching process 750 may be anisotropic or isotropic.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating semiconductor devices, comprising:
   spin-coating a patternable material on a substrate;
   forming a patterned material over the patternable material;
   patterning, based on the patterned material, the patternable material to form a pattern including one or more protruding structures; and
   lining sidewalls of each of the one or more protruding structures by depositing a silicon-containing material, while simultaneously removing at least a portion of the patterned material.

2. The method of claim 1, further comprising patterning the substrate, with the pattern together with the silicon-containing material serving as a mask.

3. The method of claim 1, wherein the step of patterning the patternable material comprises:
   etching the patternable material to form the pattern, with the patterned material serving as a mask.

4. The method of claim 3, wherein the step of lining sidewalls of each of the one or more protruding structures comprises:
   depositing the silicon-containing material with at least one of the following silicon-containing precursors: $SiF_4$ or $SiCl_4$;
   removing first portions of the silicon-containing material that overlay the patterned material and second portions of the silicon-containing material that overlay a top surface of the substrate; and
   removing the patterned material.

5. The method of claim 3, wherein the step of lining sidewalls of each of the one or more protruding structures comprises:
   depositing the silicon-containing material with at least one of the following silicon-containing precursors: $SiF_4$ or $SiCl_4$, while simultaneously removing the patterned material;
   wherein the silicon-containing material also overlays a top surface of each of the one or more protruding structures.

6. The method of claim 1, wherein the patternable material comprises at least one of an organic material, a carbon-based material, a polymer, a resist material for photo/electron lithography, a molecular crystal, or a semiconductor material comprised of molecules forming weak bonds.

7. The method of claim 1, wherein a thickness of the silicon-containing material is equal to or less than about 5 nanometers (nm).

8. The method of claim 1, wherein the silicon-containing material lining the sidewalls is configured to provide mechanical support for each of the one or more protruding structures of the pattern.

9. A method for fabricating semiconductor devices, comprising:
   forming a patternable material on a substrate;
   forming a patterned material over the patternable material;
   patterning, based on the patterned material, the patternable material to form a plurality of protruding structures; and
   depositing a lining material to line sidewalls of each of the plurality of protruding structures, while simultaneously removing at least a portion of the patterned material,
   wherein the lining material is configured to provide mechanical support for each of the plurality of protruding structures.

10. The method of claim 9, further comprising patterning the substrate using the plurality of protruding structures lined with the lining material as a mask.

11. The method of claim 9, wherein the step of patterning the patternable material comprises:

etching the patternable material to form the plurality of protruding structures, with the patterned material serving as a mask.

12. The method of claim 11, wherein the step of depositing a lining material comprises:

depositing a silicon-containing material with at least one of the following silicon-containing precursors: $SiF_4$ and $SiCl_4$;

removing first portions of the silicon-containing material that overlay the patterned material and second portions of the silicon-containing material that overlay a top surface of the substrate; and removing the patterned material.

13. The method of claim 11, wherein the step of depositing a lining material comprises:

depositing a silicon-containing material with at least one of the following silicon-containing precursors: $SiF_4$ or $SiCl_4$, while simultaneously removing the patterned material;

wherein the silicon-containing material also overlays a top surface of each of the plurality of protruding structures.

14. The method of claim 9, further comprising depositing an additional material over the plurality of protruding structures.

15. The method of claim 9, wherein the patternable material comprises at least one of an organic material, a carbon-based material, a polymer, a resist material for photo/electron lithography, a molecular crystal, or a semiconductor material comprised of molecules forming weak bonds.

16. The method of claim 9, wherein each of the plurality of protruding structures comprises a bottom layer of a first material and a top layer of a second material.

17. A method for fabricating semiconductor devices, comprising:

forming a plurality of protruding structures of a first material on an underlying layer, by patterning the first material based on a patterned material formed over the first material; and depositing a lining material to line sidewalls of each of the plurality of protruding structures, while simultaneously removing at least a portion of the patterned material;

wherein the lining material is configured to provide mechanical support for each of the plurality of protruding structures.

18. The method of claim 17, further comprising at least one of:

patterning the underlying layer, with the lined plurality of protruding structures serving as a mask; or depositing an additional material over at least a portion of the plurality of protruding structures.

19. The method of claim 17, wherein:

the first material comprises at least one of an organic material, a carbon-based material, a polymer, a resist material for photo/electron lithography, a molecular crystal, or a semiconductor material comprised of molecules forming weak bonds; and the lining material comprises a silicon-containing material.

20. The method of claim 17, wherein a thickness of the lining material is equal to or less than about 5 nanometers (nm).

* * * * *